United States Patent [19]

Amariti et al.

[11] Patent Number: 4,576,899

[45] Date of Patent: Mar. 18, 1986

[54] METHOD FOR ENHANCING APPARENT PHOTOSPEED OF DIAZONIUM PLATES BY USING THIOCYANATE TO INSOLUBILIZE DIAZONIUM COMPOUND AFTER PHOTOLYSIS

[75] Inventors: Luigi Amariti, Bloomingdale; Llandro C. Santos, Chicago, both of Ill.

[73] Assignee: Imperial Metal & Chemical Company, Philadelphia, Pa.

[21] Appl. No.: 605,796

[22] Filed: May 1, 1984

[51] Int. Cl.$^4$ ................................................. G03F 7/08
[52] U.S. Cl. ...................................... 430/309; 430/146; 430/149; 430/154; 430/168; 430/169; 430/175; 430/176; 430/302; 430/331
[58] Field of Search ............... 430/302, 309, 168, 169, 430/176, 149, 175, 146, 154, 331

[56] References Cited

U.S. PATENT DOCUMENTS

| | | |
|---|---|---|
| 2,648,604 | 8/1953 | Welliver et al. |
| 2,676,886 | 4/1954 | Barbarite . |
| 3,338,711 | 8/1967 | Boes . |
| 3,353,984 | 11/1967 | Landau ................................ 430/169 |
| 3,715,214 | 2/1973 | Kane et al. . |
| 3,854,947 | 12/1974 | Ritchey . |
| 4,093,465 | 6/1978 | Chu et al. . |
| 4,263,392 | 4/1981 | Jones . |
| 4,370,406 | 1/1983 | Jones . |
| 4,391,897 | 7/1983 | Gracia et al. ........................ 430/302 |
| 4,499,170 | 2/1985 | Amariti et al. ...................... 430/176 |

Primary Examiner—Charles L. Bowers, Jr.
Attorney, Agent, or Firm—Lockwood, Alex, Fitzgibbon & Cummings

[57] ABSTRACT

A developer is provided for lithographic plates or the like having a layer including a diazonium material, which developer enhances the effectiveness of the photolysis to which the plate had been subjected, with the result that the exposure time needed for the plate is substantially reduced. The developer, which thus enhances the apparent photospeed of the plate, includes an insolubilizing reactant that reacts with diazonium groups of diazonium materials on the plate that were not removed by photolysis during exposure in order to decrease the solubility of the diazonium material.

5 Claims, No Drawings

METHOD FOR ENHANCING APPARENT PHOTOSPEED OF DIAZONIUM PLATES BY USING THIOCYANATE TO INSOLUBILIZE DIAZONIUM COMPOUND AFTER PHOTOLYSIS

BACKGROUND AND DESCRIPTION OF THE INVENTION

This invention generally relates to developers for lithographic plates or the like, which developers include an insolubilizing reactant that enhances the apparent photospeed of plates that are developed therewith. More particularly, the invention relates to the inclusion in a plate developer of a reactant that reacts with diazonium moieties within coatings on plates that have been subjected to imagewise exposure, preferably those coatings including stabilized diazonium materials, which reactant leaves the diazonium material soluble at unexposed areas of the plate while simultaneously rendering insoluble the diazonium material at underexposed areas of the plate. The developer dissolves the diazonium material at the unexposed areas, while leaving the insolubilized, underexposed diazonium material on the plate to provide the printing images. Developers according to this invention are most advantageously utilized by intentionally underexposing the image areas of the plate such that only some of the diazonium moieties on the diazonium backbone are photolyzed, and the developer reacts with remaining diazonium moieties of the underexposed diazonium material in order to render insoluble the previously soluble underexposed image areas. Since the image areas do not have to be fully exposed to achieve the desired printing image, the exposure time needed for a particular plate is reduced considerably, thereby increasing the apparent photospeed of the plate by virtue of post-exposure treatment.

It has long been known to use diazonium materials in connection with the preparation of products such as lithographic printing plates and photoresists such as those that are provided in connection with the preparation of printed circuit boards. For convenience, when reference is made herein to a "plate", that term is intended to include products having generally rigid substrates and diazonium compositions coated thereonto, including lithographic printing plates, photoresists and the like. When the diazonium material on such plates is subjected to appropriate light sources, photolysis occurs, and the diazonium moiety is replaced with a moiety such as a halogen atom or a hydroxyl group. In the typical situation, when enough diazonium groups are thus transformed by photolysis, then the diazonium material becomes insoluble. These insoluble areas become the image areas when the exposed lithographic plate is developed, during which a developer composition removes the unexposed and thus soluble diazonium material while it does not remove the exposure-insolubilized diazonium material from which the diazonium groups have been replaced with the halogen atom or hydroxyl molecule. It has heretofore been important to expose the diazonium material at the image areas for a sufficient length of time such that the actinic energy from the light source removes enough diazonium groups so as to insolubilize the diazonium material at the image areas so that same will remain on the plate during development.

It has now been discovered that, through the use of developer compositions including a diazo-insolubilizing reactant, it is possible to obtain an adequately developed plate without having to subject the image areas to full photolysis conditions whereby the diazonium material at the image area is extensively insolubilized or fully exposed. Instead, the image areas may be exposed to a substantially lesser degree, referred to herein as being underexposed. When the developer is applied to such an underexposed plate, the insolubilizing reactant of the developer reacts with unphotolyzed diazonium groups of the exposed areas to thereby render such groups less soluble. Such less soluble groups remain on the plate, while the unexposed and more soluble groups are dissolved by the developer and removed from the plate.

It is accordingly a general object of the present invention to provide an improved plate developer.

Another object of the present invention is to provide an improved plate developer that substantially increases the apparent photospeed of plates developed therewith.

Another object of this invention is to provide an improved plate developer that chemically reduces the solubility of the diazonium material coated onto the plate, particularly diazonium material that has been exposed to minimal amounts of actinic radiation.

Another object of this invention is to provide an improved process for exposing and developing a plate which includes underexposing the image areas of the plate for a mimimal time period and subsequently chemically reducing the solubility of the diazonium material at the underexposed areas.

Another object of the present invention is to provide an improved plate and developer system or kit, the plate including an advantageously stabilized diazonium material and the developer including a diazonum insolubilizing reactant.

These and other objects of the present invention will be apparent from the following further detailed description of this invention.

Developers according to the present invention include substantial amounts of water and are typically of the emulsion type such that they include an oil phase having an oleophilic resin for enhancing the oleophilicity of the image areas, aqueous phase which may include a desensitizing agent, and an appropriate surfactant and/or emulsifying agent. These developers also include a diazonium-insolubilizing reactant.

With more particular reference to the insolubilizing reactant, this component is most advantageously a thiocyanate salt, including inorganic salts and organic salts such as metal thiocyanates including potassium thiocyanate, sodium thiocyanate, zinc thiocyanate and the like, as well as ammonium thiocyanate and amine thiocyanates including ethylpropylamine thiocyanate, ethanolamine thiocyanate, quaternary ammonium thiocyanate, and aromatic amine thiocyanates. Typically, the insolubilizing thiocyanate reactant will be present within the developer composition at a concentration of between about 0.3 and about 8 weight percent, based upon the total weight of the composition, preferably between about 0.5 and about 3 weight percent.

When the developer in accordance with this invention is of the emulsion type, the oil phase thereof, typically being between about 10 and 35 weight percent of the composition, will advantageously migrate towards the underexposed, image areas of the plate being developed, while the water phase thereof, typically between about 65 and 90 weight percent of the composition, will migrate towards the unexposed, non-image areas of the plate. Developers that are substantially single-phase aqueous compositions can also exhibit the advantageous enhanced apparent photospeed properties of this invention.

Providing the developer composition in an emulsion form has the advantage of depositing oleophilic components onto the underexposed, image areas, while minimizing oleophilic residues on the unexposed, non-image areas. It is believed that the insolubilizing reactant of this invention achieves its enhancement of the photospeed of underexposed plates by virtue of its chemical reaction with diazonium groups on diazonium materials of the plate irrespective of the physical nature of the developer. Emulsion developers are, however, especially suitable in connection with this invention because of their ability to enhance the oleophilicity of the underexposed, image areas so that these image areas are more receptive to dyes, pigments and inks, which enhances the visbility of the underexposed and developed image areas.

While not being bound by any particular theory regarding the mechanism by which the developer of this invention enhances the insolubility of the underexposed image areas of plate, it is believed that this result is achieved by chemical reaction between diazonium groups of the diazonium material coated on the plate and the insolubilizing reactant of the developer.

In this regard, the diazonium material of a plate may be schematically illustrated as two pendant diazonium groups on a polymeric backbone, the following equation illustrating the photolysis reaction that is undergone when the diazonium material is subjected to actinic radiation in the absence of polar influences and when such actinic radiation underdevelops the diazonium material to the extent that some of the diazonium groups remain unreacted.

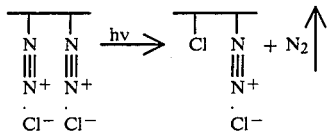

In those situations where the application of actinic radiation takes place in the presence of polar influences, the underexposed reaction can be illustrated as follows:

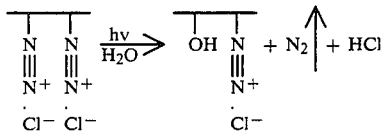

If the diazonium material undergoes more complete photolysis, then substantially all of the diazonium moieties are replaced on the backbone with the chloride ion and/or the hydroxyl group, and substantially all of the reactive diazonium groups are thus reacted, which insolubilizes the exposed diazonium material to the extent that same will remain on the plate during subsequent treatments, including development, washing, finishing and the like. However, the underexposure reactions illustrated by the preceding equations do not insolubilize the diazonium material to the extent that a more complete exposure would, which is represented by the retention of the diazonium groups on the backbone. These diazonium groups impart water soluble characteristics to the diazonium material to the extent that, as the number of these diazonium groups present in a diazonium material is reduced, the solubility of the diazonium material is decreased. Accordingly, the diazonium materials illustrated as underexposed reactant products in the preceeding equations are less soluble than the unexposed or reactant diazonium materials, but these underexposed diazonium materials are more soluble than the same diazonium materials after they have been exposed to greater quantities of actinic radiation than the underexposure radiation illustrated in the preceeding equations. By way of example, a typical underexposure condition for a type of lithographic plate is exposure for about 1 second or less in a conventional lithographic plate light exposure system, while a typical, more complete or full exposure for that same type of plate would be on the order of about 8 to 10 seconds.

Underexposed diazonium material as defined herein is believed to undergo the following change when treated with the developer of this invention:

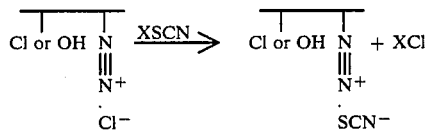

The polymeric product in the immediately preceding reaction is less soluble than the polymeric reactant thereof. This polymeric product is also less soluble than the polymeric product of the following reaction, which occurs at the unexposed, non-image areas of the plate:

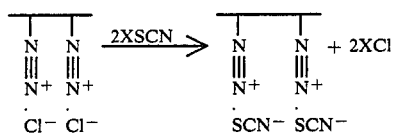

The relative difference between the solubility of the underexposed area and the solubility of the unexposed area after treatment with the developer and its thiocyanate insolubilizing reactant is greater than the relative difference between the respective solubilities of the underexposed and unexposed areas before such treatment. This increase of the difference between the respective solubilities is manifested by an enhanced developed image which has an intensity that is at least equivalent to that of a plate which had been exposed to substantially more actinic radiation and which had been developed by a conventional developer.

Plates developed in accordance with this invention should include diazonium material that has diazonium groups which are reactive with the insolubilizing reactant while being especially resistant to oxidation by which the diazonium groups revert to, for example, nitrogen dioxide groups or nitrous oxide groups over extended storage periods. Such oxidation products typically reduce the solubility of the diazonium material and can cause scumming or other imperfections in the non-image areas. Accordingly, unless fresh plates are provided, it is preferred to utilize plates that incorporate stabilized diazonium materials, such as those stabilized with zinc chloride or the like. Especially suitable plates in this regard are those described in our co-pending application Ser. No. 505,231, filed June 16, 1983, U.S.

Pat. No. 4,499,170, the disclosure thereof being incorporated by reference hereinto. These plates include a stabilizing system that inhibits what are believed to be chemical reactions including dimerization and/or trimerization of diazonium compounds and the regressive reaction of diazonium groups thereof into precursors thereof, such as —NH$_2$—NO$_2$ and/or —NO groups. This stabilizing system includes a purine derivative, especially a theophylline derivative, typically in combination with a supplementary stabilizer component such as a salt of a low molecular weight alkyl sulfonic acid or an inorganic salt stabilizer.

With further reference to stabilized plates useful within the plate system according to this invention, such include stabilized diazonium compositions that are coated from water emulsions including a diazonium material, typically added as a condensate, preferably in combination with a stabilizer system. The diazonium condensate will be included within the emulsion at a concentration of between 0.03 to about 3 weight percent, based upon the total weight of the diazonium composition, preferably between about 0.1 and about 1 weight percent. An advantageous feature of the developer in accordance with this invention is that the diazonium material on the plate can be as thin as a substantially monomolecular layer, or same can be relatively thick while still permitting the plate to have an especially fast apparent photospeed. Plates having thin diazonium layers when combined with the apparent photospeed enhancing developer of this invention are suitable for high-speed uses, for example as projection plates.

When the plate developed in accordance with the present invention is a stabilized plate including a purine derivative, such purine derivative is included at a concentration of between about 1 and 30 weight percent, based upon the total weight percent of the composition, preferably between about 2 and 20 weight percent as a total amount of one or more purine derivatives. When the stabilized diazonium composition includes a supplementary stabilizer component that is a salt of a low molecular weight sulfonic acid, it is included at a weight percent as high as about 25 weight percent, typically between about 1 and 20 weight percent, based upon the total weight of the composition. When an inorganic salt supplementary stabilizer component is included, it can be included up to its solubility limit. An inorganic salt such as zinc chloride can be included within the composition at a weight percent from 0 to about 1 percent, based upon the total weight of the composition. A polymer binder may be included within the emulsion at a weight percent as high as about 25 weight percent, preferably between about 5 and 20 weight percent, based upon the total weight of the composition. The balance of the emulsion composition is a solvent such as water, typically at a concentration greater than about 45 weight percent and usually no greater than about 90 weight percent or above.

Especially suitable purine derivatives are the theophylline derivatives, particularly those having a structure as follows:

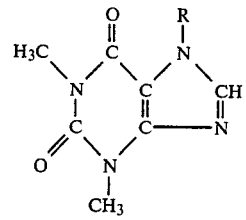

wherein R is a hydrocarbon chain of from 1 to 5 carbon atoms and having one or more hydroxyl substituents. Typically, R is an alcohol, diol or triol of from 1 to 4 carbon atoms. These compounds are particularly stable within a water emulsion, and such compounds may be used alone or in combination with another such compound within the stabilizing system according to the present invention. It is important that these purine derivatives are readily water soluble or water dispersible. Exemplary theophylline derivatives are proxyphylline, which is 7-(2-hydroxypropyl)theopylline; dyphylline, which is 7-(2,3-dihydroxypropyl)theophylline; and ethoxyphylline, which is 7-(2-hydroxyethyl)theophylline.

Supplementary stabilizing components suitable for use in these stabilized diazonium compositions are preferably low molecular weight sulfonic acid salts or inorganic salt stabilizers. The alkyl groups of these alkyl sulfonic acid salts may be unsubstituted or substituted, for example with hydroxy groups or halogens, and have a carbon chain length of between about 1 and about 6. The alkyl sulfonic acid salts that are the preferred supplementary stabilizer components include metal salts of methane sulfonic acid, of hydroxyethane sulfonic acid, of monofluoromethane sulfonic acid, of difluoro methane sulfonic acid, of trifluoromethane sulfonic acid, of chlorine-substituted alkyl sulfonic acids, and the like.

Diazo condensates that are included within diazonium compositions for plates are generally known. They are light sensitive and soluble. Illustrative examples of diazo resins which are suitable as water dispersible diazonium materials are the condensation products of an aldehyde with a diazo compound having an amine substituent such as, for example, a water soluble condensation product of a para-diazo diphenylamine and formaldehyde, which are typically furnished as salts, such as zinc chloride salts. Other diazonium materials which can be used include the diazo oxides such as pyrido[1,2-a]benzimidazol-8-yl3 (4H)-diazo-4 (3H)-oxo-1-naphthalene sulfonate. Diazonium compounds which can also be used include such materials as 4'-bromodiphenylamine-4-diazonium chloride; 4'-chlorodiphenylamine-4-diazonium chloride; 4-methoxydiphenylamine-4-diazonium chloride; 3'-methoxydiphenylamine-4-diazonium chloride; 3'-propoxydiphenylamine-4-diazonium chloride; X,X$_1$,X$_2$-tribromodiphenylamine-4-diazonium chloride; 4'-methyldiphenylamine-4-diazonium chloride; 4'-hydroxyldiphenylamine-4-diazonium chloride; 4'-benzoylaminodiphenylamine-4-diazonium chloride; 4'-fluorodiphenylamine-4-diazonium chloride; 2-anilidosulfonyldiphenylamine-4-diazonium chloride; 2-(p-toluene-sulfonyl-amino)-diphenylamine-4-diazonium chloride; p-diazo-N-ethyl-N-benzyl aniline ½ZnCl$_2$; 4'-diazo-2-chloro-N,N'-diethylaniline-½ZnCl$_2$; and other similar and well known diazonium materials.

Diazonium compositions included on these types of plates are part of a plate system that is of the negative working variety. Additive, negative working plates are especially suitable in connection with this invention, although subtractive, negative working plates are also suitable. Additive plate and developer systems are especially advantageous in connection with the application of the present invention because a pigmented additive developer enhances the visibility of the image areas as they are chemically insolubilized by the developer of this invention.

The light sensitivity of plates generally corresponds to the time that it takes to undergo photolysis to the degree necessary for producing image areas that sharply contrast with the non image areas. This property of a plate is often measured by a sensitivity guide, which is a mask through which a plate is exposed to actinic radiation. Sensitivity guides are well known and widely used in the industry, a very popular one being the Kodak T-14 Sensitivity Scale. Such sensitivity guides include a scale or so-called step wedge that provides a continuous-tone gray scale through which light is transmitted during exposure to actinic radiation. An especially sensitive plate will be photolyzed by a minimal amount of actinic energy passing through the sensitivity guide. Each increasingly numbered step of the continuous-tone gray scale decreases in transparency, and photoylsis at a relatively high step per unit of actinic energy passed through the guide indicates a plate having a rapid photospeed. With respect to lithographic plates, a standard source of actinic energy is a Berkey Ascor Vacuum Printer. A plate of relatively fast photospeed that is developed with a conventional developer exhibits a solid step 5 when exposed for about 8 to 10 seconds within such an exposure unit. When that same type of plate is exposed for only ½ to 1 second, a solid step 6 is obtainable when the plate is developed with the developer of this invention.

Developers will typically include an oleophilic resin in order to enhance the image formation at the exposed areas, and such oleophilic resins will typically be included within the developers at concentrations between 0.5 and about 3 weight percent, based upon the total weight of the composition. Generally, an oleophilic resin should be used in conjunction with a solvent therefor in order to assist in maintaining the oleophilic resin within the developer during storage and use. The developer will also include substantial quantities of water, generally between about 40 and 70 weight percent of the developer composition. A protective colloid or desensitizing agent, such as a natural gum, a synthetic gum, a starch, hydroxyethyl cellulose or the like, will usually be included in order to desensitize the background or non-image areas, at concentrations between about 2 and about 20 weight percent, based on the total weight of the composition. Adherent material suitable for resin reinforcement and as a scouring aid, such as talc or finely divided polyethylene, will improve the working properties of the developer, and such may be included at concentrations between about 5 and about 25 weight percent, based on the total weight of the composition. Other ingredients may be included as desired, including surfactants, emulsifiers, pigments, humectants, suspending agents and buffers or buffering systems.

EXAMPLE I

A plate having a stabilized diazonium layer was severed into a plurality of smaller plates or portions, and each portion was exposed through a Kodak T-14 Sensitivity Scale for a 4 second exposure time within a Berkey Ascor Vacuum Printer. One of the plate portions was developed with water containing about 10 weight percent of gum arabic and was subsequently inked with a black rub-up or triple ink. This plate exhibited a faint image that was less than a solid step 1.

Another one of the exposed plate portions was developed with a composition of water, about 10 weight percent of gum arabic, and 0.5 weight percent of ammonium thiocyanate and then inked with the same black rub-up ink. The developed and inked plate exhibited a solid step 4. Another one of the exposed plates was developed with a developer composition of water, about 10 weight percent gum arabic and 4 weight percent ammonium thiocyanate. A solid step wedge of 2½ was observed upon inking.

EXAMPLE II

Lithographic plates including a water soluble diazonium material stabilized with a theophylline derivative were cut into portions. The plates were from the same lot. Two of these plate portions were exposed for 1 second through a T-14 sensitivity scale. One of these plate portions was developed with a one-step black additive developer that is available commercially from Witco Chemical Company under the trademark ASTRA BLACK MAXI-RUN. The washed plate did not show any solid steps, although a faint image was visible on the plate. Another plate portion was developed with the same Astra black developer to which about 1 weight percent of ammonium thiocyanate had been added. The image on the plate was between a solid step 4½ and solid step 5.

Substantially the same solid step 4½ to solid step 5 image was attained by using the unmodified Astra black developer only after the plate was exposed for 8 seconds. Another one of these plates, when exposed for 10 seconds, gave a solid step of about 5 to 5½.

EXAMPLE III

An emulsion developer was prepared having an oil phase including 2 percent of an oleophilic resin, 9 percent of a solvent for the oleophilic resin, 1 percent of a surfactant, 9 percent of a humectant and 2 percent of a pigment, all percentages being based upon the total weight of the developer composition. The remainder of the emulsion, including the water phase, had 52 weight percent water, 5 percent gum, 14 percent talc, 3 percent buffers, 1.4 percent suspending agent, and 1.6 percent ammonium thiocyanate. The emulsion had a pH of 4.2, and the viscosity of the emulsion developer was 185 centipoise. This emulsion was used to develop a lithographic plate having a stabilized diazonium component and which was exposed for 1 second to give an image having a 4 to 5 solid step.

EXAMPLE IV

Astra black one-step additive developer was modified by adding varying concentrations of potassium thiocyanate thereto. Each thus prepared composition was used to develop stabilized diazonium-containing plates that had been exposed for 1 second. The developer containing 0.5 weight percent of potassium thiocyanate provided a solid step 7 image, having slight background specks. The developer containing 1 percent potassium thiocyanate gave a solid step 5 to 6, with a clean background. The composition containing 2 percent potassium thiocyanate gave a solid step 5 and a cleaner background, while the developer composition having 3 percent potassium thiocyanate gave a solid step of 4 with a very clean background.

EXAMPLE V

A pigmented one-step additive developer available from Western was modified by adding 1.5 weight percent of potassium thiocyanate thereto. A presensitized additive plate including stabilized diazonium materials coated thereon was exposed for 1 second, and the developed plate gave a solid step of 5, with slight scumming.

EXAMPLE VI

A Witco S-55 presensitized diazonium plate was developed with Astra black one-step developer that had been modified to include 1.5 weight percent of ammonium thiocyanate in order to provide a developed plate that, when underexposed, is substantially enhanced in its apparent photospeed in order to give an acceptable printing image.

EXAMPLE VII

A pigmented one-step developer to which varying amounts of ammonium thiocyanate were added were used to develop an additive lithographic plate having a diazonium composition including zinc chloride and dyphylline, which plates were exposed for 1 second. The developer composition having 0.5 weight percent of ammonium thiocyanate gave a solid step 7, with slight background steps, while the developer containing 1 weight percent of ammonium thiocyanate gave a solid step 5 to 6 and a clean background, and the developer containing 2 weight percent of ammonium thiocyanate gave a solid step 5 and a very clean background.

EXAMPLE VIII

Sodium thiocyanate was incorporated into a pigmented one-step developer. This developer resulted in the imaging of a satisfactory step and provided a clean background when used to develop an additive plate having a stabilized diazonium composition.

EXAMPLE IX

Modifying a black additive developer by adding zinc thiocyanate thereto enhances the apparent photospeed of an underdeveloped additive lithographic plate when that plate is subsequently developed by such developer.

EXAMPLE X

Astra black one-step developer was modified by incorporating thereinto 1 percent ethylpropylamine thiocyanate that had been synthesized by reacting calcium thiocyanate with ethylpropylamine within sulfuric acid and water. This developer provided a solid step 5 image on a Witco additive plate including a diazo resin stabilized with a purine derivative. This plate had been exposed for 1 second.

It will be understood that the embodiments of the present invention which have been described are merely illustrative of a few of the applications of the principles of the present invention. Numerous modifications may be made by those skilled in the art without departing from the true spirit and scope of the invention.

What is claimed is:

1. A method for enhancing the apparent photospeed of a plate having a layer including a diazonium material, comprising:
   selectively photolyzing a plate to define image areas, said plate having a layer including a light-sensitive, negative-working diazonium material, said selective photolyzing including underexposing the diazonium material at the image areas, said underexposing including removing some, but not all, diazonium groups from the diazonium material;
   applying a developer composition to the selectively photolyzed and underexposed plate, wherein said developer composition includes substantial amounts of water and an insolubilizing reactant, said insolubilizing reactant being a thiocyanate salt that is present in an amount sufficient to enhance the apparent photospeed of the plate;
   reacting the insolubilizing reactant of the applied developer composition with unphotolyzed diazonium groups of the diazonium material at the image areas in order to reduce the solubility of the selectively photolyzed diazonium material; and
   removing unphotolyzed diazonium material from the plate while substantially retaining the photolyzed and reacted diazonium material on the plate at the image areas, wherein said unphotolyzed diazonium material is soluble in the developer composition and said photolyzed and reacted diazonium material at the image areas is insoluble in the developer composition.

2. The method according to claim 1, wherein said selective photolyzing step includes subjecting the diazonium material to actinic radiation for a period of time substantially less than that needed to substantially fully photolyze the exposed diazonium material.

3. The method according to claim 1, wherein said selective photolyzing step is preceded by a step of providing a plate having a stabilized diazonium material.

4. The method according to claim 1, wherein said selective photolyzing step is preceded by a step of providing a plate having a stabilized diazonium material that is stabilized with a purine derivative.

5. The method according to claim 1, wherein said reacting step includes reacting —NN.Cl groups with —SCN groups to form —NN.SCN moieties.

* * * * *